(12) United States Patent
Brielmann et al.

(10) Patent No.: US 6,558,576 B1
(45) Date of Patent: May 6, 2003

(54) LUMINESCENT ELECTROCONDUCTIVE ADHESIVE

(75) Inventors: Volker Brielmann, Waiblingen (DE); Hans-Peter Fuessl, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/646,209

(22) PCT Filed: Jan. 11, 2000

(86) PCT No.: PCT/DE00/00069

§ 371 (c)(1),
(2), (4) Date: Nov. 22, 2000

(87) PCT Pub. No.: WO00/42114

PCT Pub. Date: Jul. 20, 2000

(30) Foreign Application Priority Data

Jan. 14, 1999 (DE) .......................... 199 01 107

(51) Int. Cl.⁷ ............................ H01B 1/20; C09K 11/06
(52) U.S. Cl. ............. 252/500; 252/301.16; 252/301.21
(58) Field of Search ................... 252/500, 514, 252/582, 589, 301.16, 301.21, 301.26

(56) References Cited

U.S. PATENT DOCUMENTS

| | | | |
|---|---|---|---|
| 4,999,136 A | | 3/1991 | Barrett et al. |
| 5,645,764 A | * | 7/1997 | Angelopoulos et al. ...... 252/500 |
| 5,700,398 A | * | 12/1997 | Angelopoulos et al. ...... 252/500 |
| 6,165,592 A | * | 12/2000 | Berger et al. ................ 428/195 |
| 6,211,524 B1 | * | 4/2001 | Vardeny et al. .......... 250/458.1 |

FOREIGN PATENT DOCUMENTS

EP  0 680 411  11/1995

OTHER PUBLICATIONS

Emerson & Cuming, Technical Data Sheet, ABLEBOND® 84–1LMI Electrically Conductive Epoxy Adhesive, 11/95.

* cited by examiner

Primary Examiner—Mark Kopec
(74) Attorney, Agent, or Firm—Kenyon & Kenyon

(57) ABSTRACT

An electroconductive adhesive to which a luminescent heterocyclic compound, especially a benzoxazol, is added. The ratio of the heterocyclic compound in the adhesive, which preferably is a silver-charged, epoxy-resin adhesive, is 0.01% to 0.5% by weight. The adhesive is especially suitable for bonding electrical components to circuit carriers where automated process control is employed.

8 Claims, No Drawings

LUMINESCENT ELECTROCONDUCTIVE ADHESIVE

BACKGROUND INFORMATION

Electroconductive adhesives are known in the art and are commercially available. For more information on this, refer for example to the product "Ablebond 84-1 LMI" of the Ablestik company, 20021 Susana Road, Rancho Dominguez, Calif. 90221, U.S., which is a silver-charged, epoxy-resin-based adhesive.

Also known in the art are electrically non-conductive adhesives to which an optical brightener is added to create luminescence in the visible spectral range, for example by excitation in the ultraviolet range using a UV lamp. For more information on this, refer for example to the known acrylate adhesives of the Loctite and the Panacol companies. Furthermore, non-conductive adhesives of this type are already used industrially in the series production of electrical circuit carriers in order to render accessible the processing steps of an automatic detection using imaging devices and, thus, provide automated quality and process control.

However, in previous art, there has been no known electrically conductive adhesive having an additive that is luminescent, especially in the visible spectral range, where the luminescence of the additive is excited, for example, by UV radiation.

Approaches of this type have failed so far in that a suitable additive has not yet been found, since electroconductive adhesives are typically filled with metallic particles, such as silver in particular, which, because of their absorption, in many cases impede detectable luminescence.

SUMMARY OF THE INVENTION

An object of the present invention is, therefore, to add a suitable additive that becomes luminescent when light strikes it (in response to incident light) to a known electrically conductive adhesive, making it possible for this adhesive to be used in the bonding of electrical components where automated process control is employed.

The adhesive according to the present invention has the benefit over the related art that, when using electroconductive adhesives—which can be either isotropically or anisotropically electroconductive—and when applying them to organic or inorganic circuit carriers in electronics, any types of defects that may arise can be simply and automatically detected.

These defects can include fouling of the circuit carrier or of a mounted component by the adhesive, bleeding of the adhesive, or washing away of conductive particles from the adhesive.

These defects frequently occur in the application of adhesive, for example by silk screening or screen printing, in stamping or dispensing, or when inserting the components, for example by the splashing of adhesive. Due to the continuing progress of miniaturization, it is becoming increasingly difficult to detect these defects using traditional methods, such as visual inspection.

The adhesive according to the present invention very beneficially permits automated checking using known imaging devices, even for very small components or circuits, and thus permits automated process and quality control for the application of adhesive or in checking for the possible fouling of substrate base material. Moreover, it enables the bleeding and washout behavior of the conductive adhesive on the substrate or the circuit carriers to be analyzed. In particular, the reflections and specular reflections of the inspection lighting that would otherwise result when using electrically conductive adhesives due to conductive adhesive topographies are very beneficially avoided.

A benzoxazol as a heterocyclic compound that is added to the adhesive, preferably in a ratio of 0.01–0.5%, especially 0.05%, by weight, is especially beneficially suitable as the luminescent additive to the electroconductive adhesive.

A known, commercially available, silver-charged epoxy-resin adhesive is beneficially used as the electroconductive adhesive.

Moreover, it is very beneficial that the brightness of the adhesive excited by luminescence is in the visible spectral range and that it can be excited, for example, by radiation using a UV lamp.

DETAILED DESCRIPTION

The adhesive product "Ablebond 84-1 LMI" of the Ablestik, U.S., company is first specified as the electroconductive adhesive. This is a silver-charged, epoxy-resin adhesive. A benzoxazol as the heterocyclic compound is added to it and mixed with the adhesive in a known way. The benzoxazol is used as an optical brightener in the adhesive and also to create luminescence. Its ratio in the adhesive is between 0.01 and 0.5%, preferably at 0.05%, by weight. Benzoxazol 2,2'-(2,5-thiophenediyl)-bis(5-(1,1-dimethylethyl))-benzoxazol or 4-phenyl-4'-benzoxazol-stilbene has proven to be especially suitable.

This luminescent electroconductive adhesive is applied to electrical circuit carriers in a known way. The luminescence of the adhesive is excited, for example, by UV light and detected using a luminescence meter or an optical imaging device, in a known way, within an automated process control system.

What is claimed is:

1. An electroconductive adhesive, comprising:

an additive including a luminescent heterocyclic compound, wherein the compound includes benzoxazol.

2. The electroconductive adhesive according to claim 1, wherein a percentage of the compound in the adhesive is between 0.01 and 0.5% by weight.

3. An adhesive comprising:

an electroconductive adhesive having a luminescence occurring in the visible wavelength range, the adhesive including a luminescent heterocyclic compound, wherein the compound includes benzoxazol.

4. The adhesive according to claim 3, wherein the luminescence is in response to an excitation in the ultraviolet range.

5. The adhesive according to claim 3, wherein the adhesive bonds electrical components to circuit carriers where automated process control is employed using imaging devices.

6. An electroconductive adhesive, comprising:

an additive including a luminescent heterocyclic compound, wherein the percentage of the compound in the adhesive is about 0.05% by weight.

7. The electroconductive adhesive according to claim 6, wherein the adhesive is a silver-charged, epoxy-resin adhesive.

8. The electroconductive adhesive according to claim 6, wherein the adhesive bonds electrical components to circuit carriers where automated process control is employed using imaging device.

* * * * *